United States Patent [19]
Yun et al.

[11] Patent Number: 5,336,630
[45] Date of Patent: Aug. 9, 1994

[54] METHOD OF MAKING SEMICONDUCTOR MEMORY DEVICE

[75] Inventors: Kwang H. Yun; Hee G. Lee; Seong J. Jang; Young K. Jun, all of Seoul, Rep. of Korea

[73] Assignee: Goldstar Electron Co., Ltd., Rep. of Korea

[21] Appl. No.: 975,884

[22] Filed: Nov. 13, 1992

[30] Foreign Application Priority Data

Nov. 15, 1991 [KR] Rep. of Korea .............. 20387/1991
Jan. 15, 1992 [KR] Rep. of Korea .............. 477/1992

[51] Int. Cl.$^5$ .............................................. H01L 21/70
[52] U.S. Cl. ........................................ 437/52; 437/47; 437/48; 437/60; 437/229; 437/919
[58] Field of Search .................. 437/47, 52, 60, 80, 437/229, 919; 430/312, 314

[56] References Cited

U.S. PATENT DOCUMENTS 5,213,992  5/1993  Lu .................................... 437/977

OTHER PUBLICATIONS

Jinbo et al. "0.2 μm Or Less i-Line Lithography Phase-Shifting Mask Technology" IEDM 90 pp. 825–828.

*Primary Examiner*—Tom Thomas
*Attorney, Agent, or Firm*—Poms, Smith, Lande & Rose

[57] ABSTRACT

A method of making a semiconductor memory device wherein a storage node having a plurality of pillars, capable of increasing the storage node surface area and thus the cell capacitance. The storage node is formed by depositing a storage node polysilicon film to have a thickness of 5,000 Å to 6,000 Å over a semiconductor substrate, forming a photoresist pattern over the polysilicon film in a direct electron beam writing manner, and etching the polysilicon film up to a depth of 1,000 Å from the upper surfaces of a gate and a bit line by using the photoresist pattern. The formed storage node has a plurality of uniformly spaced pillars. Alternatively, the storage node is formed by forming a smoothing insulating film over the semiconductor substrate depositing a storage node polysilicon film over the smoothing insulating film, primarily photo exposing the semiconductor substrate using a glass mask having phase shifters, secondarily photo exposing the semiconductor substrate under the condition of rotating 90° the semiconductor substrate, to form a check-board photoresist pattern, and patterning the polysilicon film using the photoresist pattern as a mask. The formed storage node has a plurality of pillars arranged independently or intersectionally.

8 Claims, 10 Drawing Sheets

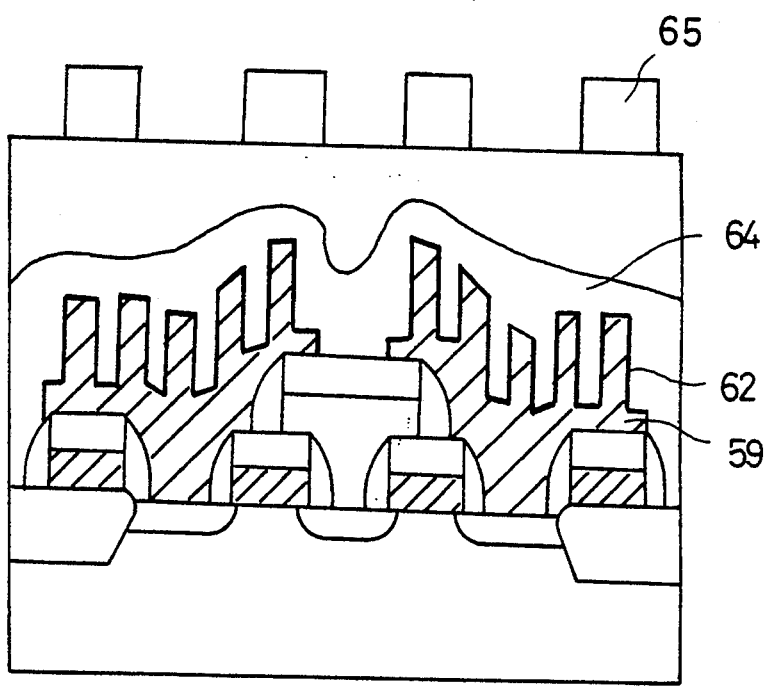
F I G. 3e

F I G. 4e
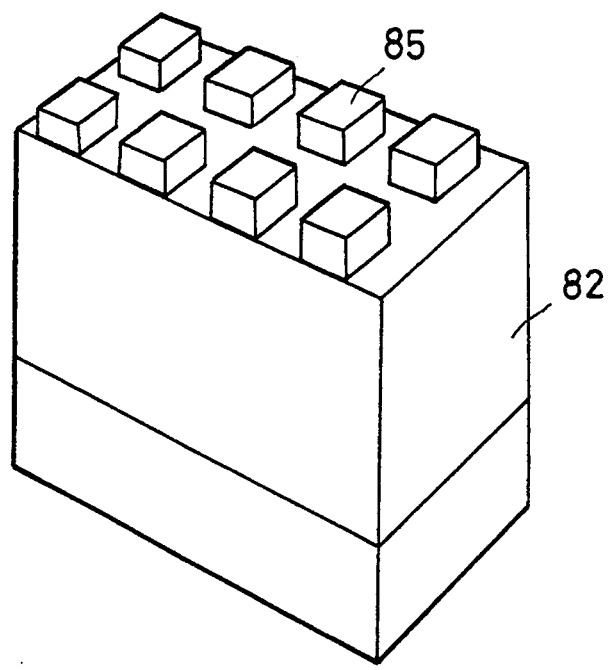
F I G. 4f
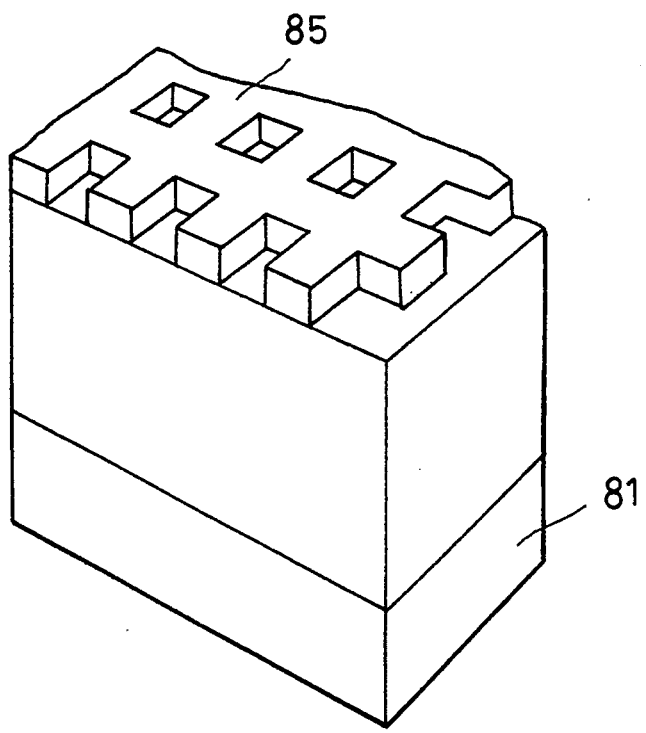

METHOD OF MAKING SEMICONDUCTOR MEMORY DEVICE

BACKGROUND OF THE INVENTION

1. Field of the Invention

The present invention relates to a method of making a semiconductor memory device, and more particularly to a method of making a semiconductor memory device, capable of increasing the storage node surface area and thus the cell capacitance.

2. Description of the Prior Art

The development of manufacturing techniques for semiconductor devices has, promoted the development of high capacitance dynamic random access memories (DRAMs) of high capacitance. For this reason, the physical area occupied by one memory cell in a semiconductor device is inevitably on a decreasing trend.

Generally, a DRAM devices comprises memory cells each including a metal oxide semiconductor capacitor and a metal oxide semiconductor (MOS) transmission transistor. The signal level upon reading information stored in memory cells depends on the amount of charge accumulated in the MOS capacitors. As a result, the effective capacitor area can not be greatly reduced, taking into consideration the requirement that the area occupied by the memory cells should be reduced for achieving the high capacitance of DRAM cells.

An important problem encountered in achieving the high capacitance of DRAM cells is how to make the capacitance of memory cells increase under the condition that the area occupied by the memory cells is minimized.

As a method for increasing the capacitance of memory cells without an increase in the area occupied by the memory cells, there have been known a method for making a capacitor insulating layer very thin, a method for increasing the dielectric constant of capacitor insulating layer and a method for increasing the capacitor area.

Among the methods for increasing the capacitance area, however, the method for making a capacitor insulating layer very thin encounters a limitation on the reliance of a DRAM device manufactured. For increasing the dielectric constant, the capacitor insulating layer may be made of $Si_3N_4$, in place of $SiO_2$. However, this method also encounters a problem as to the reliance of DRAM device.

Accordingly, a stacked capacitor structure and a trenched capacitor structure have been also been proposed as methods capable of increasing the cell capacitance without an increase in the area occupied by the memory cells.

The present invention is concerned with a method of making a DRAM device with a structure in which a storage node has a plurality of pillars so that its surface area is increased, thereby enabling the cell capacitance to increase.

FIGS. 1A to 1D are sectional views illustrating a method for making a DRAM device with a conventional structure in which a storage node has opposite side walls for increasing the cell capacitance. Basically, the method comprises the steps of forming a MOS transistor, forming a bit line over a bit line contact, and forming a stacked capacitor.

In accordance with the method, first, on a silicon substrate 11 which has a field oxide film 12 for isolating elements from one another are formed an impurity region 13 of a conductivity type opposite to that of the silicon substrate 11, a gate 14 and a gate insulating film 15, in this order, so as to form a MOS transistor, as shown in FIG. 1A.

Thereafter, a bit line contact is formed by removing a portion of the gate insulating film 15 corresponding to a region at which a bit line will be formed. Over the bit line contact, a bit line 16 and a bit line insulating film 17 are formed.

As the step of forming a capacitor, a polysilicon film is selectively deposited only over the capacitor contact, so as to form a polysilicon plug 18. Over the resultant entire exposed surface after the formation of plug 18 are coated a nitride film 19 and an oxide film 20, in this order. Thereafter, a photoresist 21 is coated. The photoresist 21 is then subjected to a patterning for forming a pillar forming pattern.

By using the photoresist pattern as a mask, the oxide film 20 and the nitride film 19 are sequentially etched to form pillars, as shown in FIG. 1B. Subsequently, the photoresist pattern is removed. For etching, the nitride film 19 should have a high etch selectivity, as compared with the oxide film 20.

Over the resultant entire exposed surface, a polysilicon film 22 for a storage node is then deposited, as shown in FIG. 1C. The polysilicon film 22 is subjected to a smoothing treatment using an oxide film or a silicon-on-glass (SOG) film. Thereafter, the polysilicon film 22 is etched back, so as to remove its portion disposed over the oxide film 20. As a result, neighboring elements are isolated from each other.

As shown in FIG. 1D, the nitride film 19 disposed over the oxide film 20 is then removed. Although not shown, a dielectric film is formed over the polysilicon film 22. Finally, a formation of a plate node on the dielectric film is carried out. Thus, a capacitor is made.

However, this conventional method wherein the storage node having a side wall structure is formed for increasing the cell capacitance involves the smoothing treatment for nitride film which results in a difficulty in carrying out the method. Moreover, the selective deposition of polysilicon film for forming the plug only at the capacitor contact requires a sophisticated technique and an expensive equipment, The conventional method also has a difficulty in achieving a mass production, since the nitride film requires a high etch selectivity over the oxide film and the pillars should be shaped to be perpendicular to the substrate.

Referring to FIGS. 2A to 2C, there is illustrate a method of making a DRAM device with another conventional structure. In this conventional method, a knurled surface is formed at the surface of a storage node, so as to increase the cell capacitance.

FIGS. 2A to 2C illustrate a part of the processes for making a DRAM device, that is, a process for forming a capacitor after the formation of a transistor and a bit line on a silicon substrate 31. The formation of a transistor and a bit line is carried out, in a similar manner to that illustrated in FIGS. 1A to 1D. For 20 simplify the illustration, the transistor and bit line are not shown and only the capacitor is shown in FIG. 2A to After the formation of transistor and bit line, an insulating film 33 is formed over the silicon substrate 31 having an impurity region 32, as shown in FIG. 2A. The insulating film 33 is then partially etched to expose the impurity region 32 to external. Accordingly, a capacitor contact 34 is formed over the exposed portion of impurity region 32. Over the resultant entire exposed surface, a doped polysilicon film 35 is deposited to have a predetermined thickness, using a low pressure chemical vapor deposition (LPCVD) method which is carried out at a temperature of 600° C. The polysilicon layer 35 is then subjected to a patterning for forming a capacitor contact 34 thereon.

Thereafter, another polysilicon film 36 is deposited over the resultant entire exposed surface, as shown in FIG. 2B. The deposition is achieved by using a SiH4 gas diluted with helium (He) (about 20%) at a pressure of 1 Torr and a temperature of 550° C.

The polysilicon film 36 is then etched back, using an anisotropic dry etch method utilizing a HBr gas, so as to remove it except for its portion contacting with the side walls of the patterned polysilicon film 35, as shown in FIG. 2C. As a result, a storage node having a knurled surface is formed in a self-aligned manner.

Although not shown, a dielectric film is then formed over the entire surface of the storage node, Finally, a formation of a plate node on the dielectric film is carried out. Thus, a capacitor is made.

Assuming the knurled surface of the Storage node shown in FIG. 2C have a plurality of hemisphere knurls, the ratio of the total surface area of the knurled storage node to the surface area of the storage node having a planar surface can be expressed by the following equation:

$$\frac{2\pi r^2}{\pi r^2} \quad (1)$$

As apparent from the equation, it is difficult to increase the surface area of the knurled storage node in excess of two times the surface area of the planar storage node. Consequently, the method for increasing the surface area of storage node by forming a knurled surface at the storage node has a limitation on an increase in cell capacitance.

SUMMARY OF THE INVENTION

Therefore, an object of the invention is to provide a method of making a semiconductor memory device wherein a polysilicon film is patterned in a direct electron beam writing manner to form a storage node having a plurality of pillars, thereby capable of simplifying the processes and greatly increasing the cell capacitance.

Another object of the invention is to provide a method of making a semiconductor memory device wherein a storage node is formed using a mask having a plurality of uniformly arranged rectangular phase shifters, to have a plurality of pillars arranged independently or intersectionally in planar (in a two-dimensional plane that intersects the pillars perpendicularly), thereby capable of greatly increasing the cell capacitance.

In one aspect, the present invention provides a method of making a semiconductor memory device comprising the steps of: forming, on a semiconductor substrate provided with a field oxide film, an impurity region, a gate, a gate insulating film and gate side wall spacers, in this order, to form a transistor; forming, over a bit line contact region, a bit line, a bit line insulating film and bit line side wall spacers, in this order; depositing a polysilicon film over the resultant entire exposed surface of the semiconductor substrate; coating a photoresist over the polysilicon film and patterning the photoresist in a direct electron beam writing manner; etching the polysilicon film using the patterned photoresist as a mask, to form a storage node having a plurality of pillars; removing a portion of the polysilicon film disposed over the field oxide film and the bit line using the storage node as a mask; forming a dielectric film over the entire exposed surface of the storage node; and forming a plate node over the dielectric film, In another aspect, the present invention provides a method of making a semiconductor memory device comprising the steps of: forming, on a semiconductor substrate provided with a field oxide film, an impurity region, a gate, a gate insulating film and gate side wall spacers, in this order, to form a transistor; forming, over a bit line contact region, a bit line, a bit line insulating film and bit line side wall spacers, in this order; depositing a polysilicon film over the resultant entire exposed surface of the semiconductor substrate; preparing a glass mask having a plurality of phase shifters; coating a photoresist over the polysilicon film; primarily photo exposing the semiconductor substrate under the condition of fixing the glass mask at a position spaced a predetermined distance from the semiconductor substrate; secondarily photo exposing the semiconductor substrate under the condition of rotating 90° the semiconductor substrate at the same position as in the step of primarily photo exposing the semiconductor substrate; developing the photoresist to form a photoresist pattern; patterning the polysilicon film using the patterned photoresist as a mask, to form a storage node having a plurality of pillars; removing the photoresist; forming a dielectric film over the entire exposed surface of the storage node; and forming a plate node over the dielectric film.

BRIEF DESCRIPTION OF THE DRAWINGS

Other objects and aspects of the invention will become apparent from the following description of embodiments with reference to the accompanying drawings in which:

FIGS. 3A to 3E are sectional views illustrating a method of making a semiconductor memory device in accordance with a first embodiment of the present invention; and FIGS. 4A to 4H are sectional views illustrating a method of making a semiconductor memory device in accordance with a second embodiment of the present invention,

DETAILED DESCRIPTION OF THE PREFERRED EMBODIMENTS

Referring to FIGS. 3A to 3E, there is illustrated a method of making a semiconductor memory device in accordance with a first embodiment of the present invention.

The method of the first embodiment of the present invention is a method for increasing the surface area of storage node and thus the cell capacitance, by patterning a polysilicon film in a direct electron beam writing manner to form a storage node having a plurality of pillars.

Figure 1A:
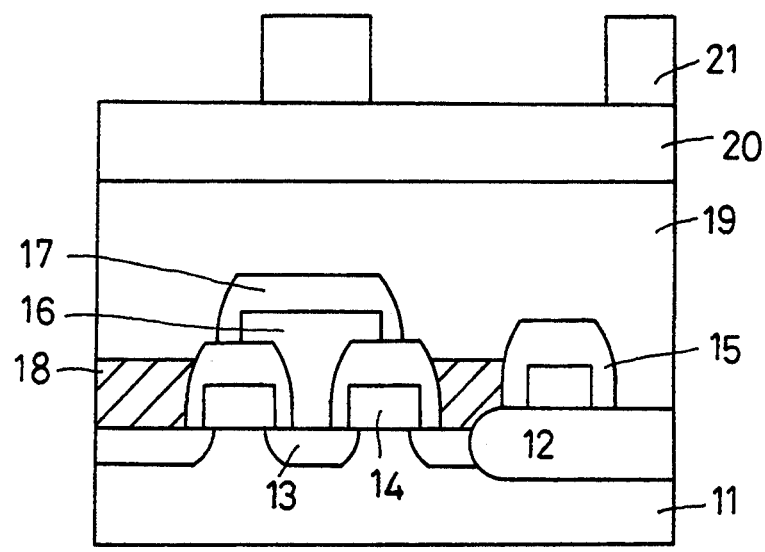
FIGS. 1A to 1D are sectional views illustrating a method of making a DRAM device with a conventional structure in which a storage node has opposite side walls.
Figure 1B:
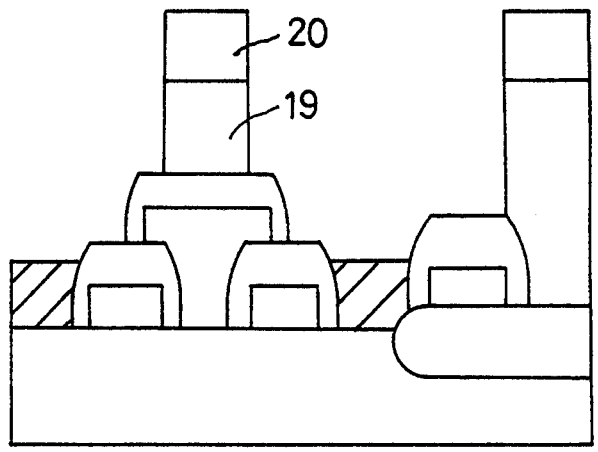
Figure 1C:
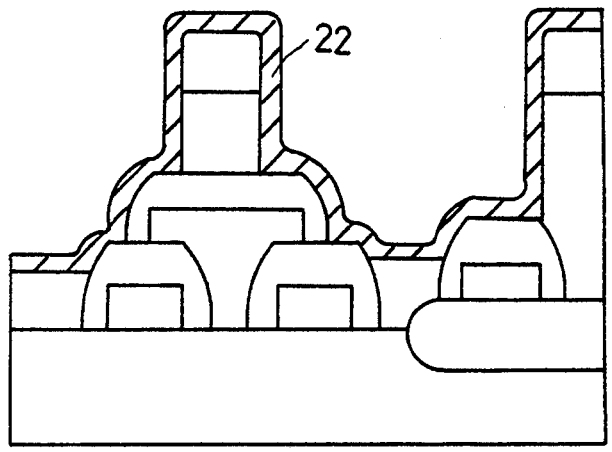
Figure 1D:
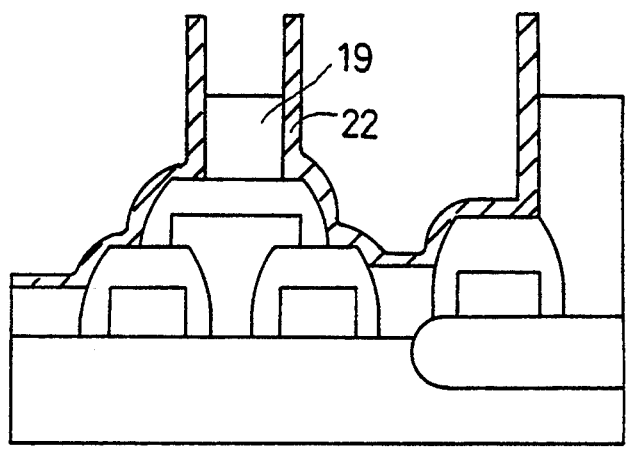
Figure 2A:
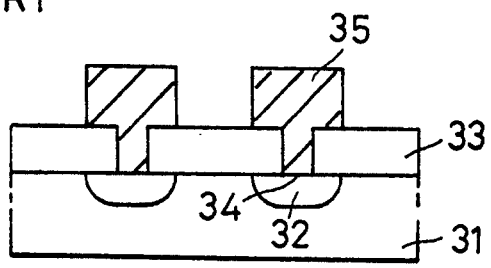
FIGS. 2A to 2C are sectional views illustrating a method of making a DRAM device with another conventional structure in which a storage node has a knurled surface.
Figure 2B:
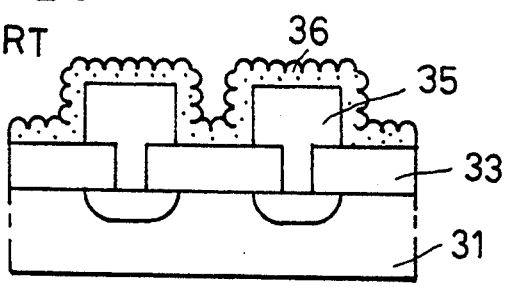
Figure 2C:
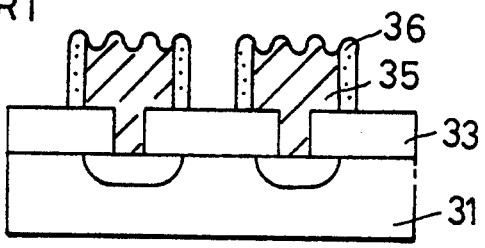
Figure 3A:
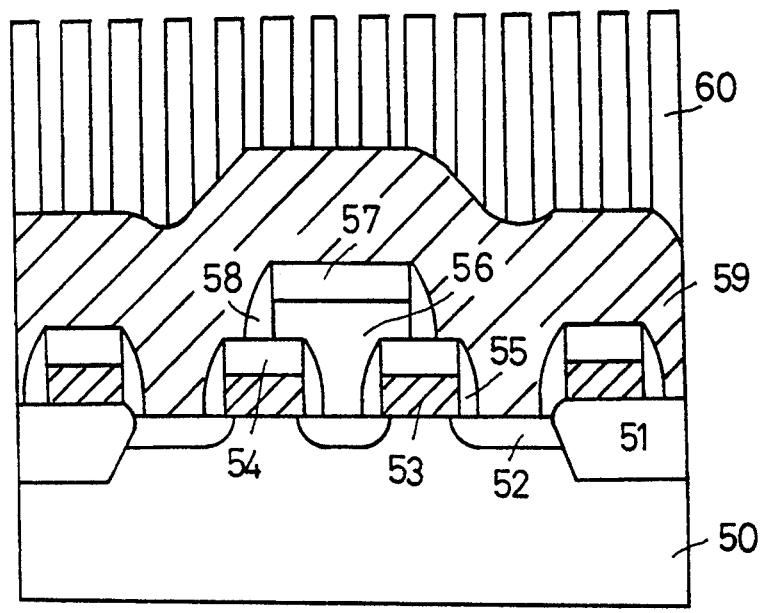

In accordance with the method, on a semiconductor substrate 50 is formed a field oxide film 51 for isolating elements from one another, as shown in FIG. 3A. An impurity region 52 of a conductivity type opposite to that of the silicon substrate 50 is then formed by implanting impurity ions of the same conductivity in the silicon substrate 51.

Over the silicon substrate 50 are formed a gate 53 serving as a word line, a gate oxide film 54 and a gate side wall oxide film 15, in this order, so as to form a transistor.

Thereafter, a bit line contact is formed in a conventional manner and a bit line 56 is formed over the bit line contact. Over the bit line contact, a bit line 16 and a bit line insulating film 17 are formed. A bit line insulating film 57 and its side wall spacers 58 are also formed sequentially.

For forming a capacitor, a polysilicon film 59 for a storage node is deposited over the resultant entire exposed surface, to have a thickness of 5,000 Å to 6,000 Å. Over the polysilicon film 59 is then deposited a photoresist 60 which is, in turn, patterned in a direct electron beam writing manner.

Figure 3B:
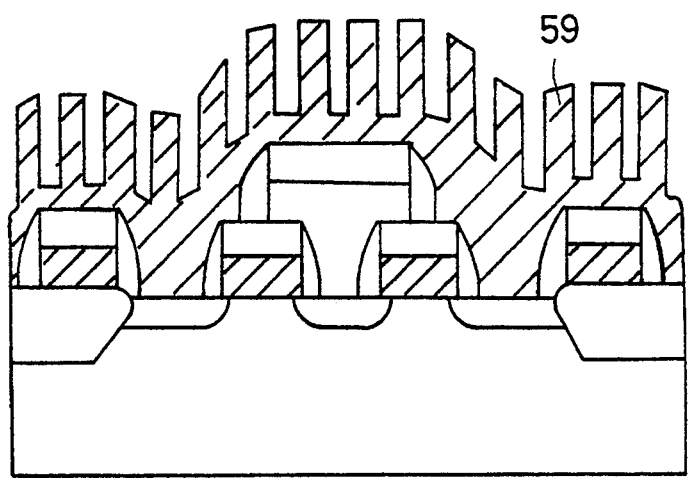

Using the patterned photoresist 60 as a mask, the polysilicon film 59 is etched according to a reactive ion etch method, to form a storage node having a plurality of pillars, as shown in FIG. 3B. Subsequently, the photoresist 60 is removed.

The storage node has a structure with a plurality of uniformly spaced pillars arranged in one direction.

The formation of storage node with such a structure is achieved by carrying out the etching of polysilicon film 59 to a depth of 1,000 Å from the upper surface of bit line or gate.

Figure 3C:
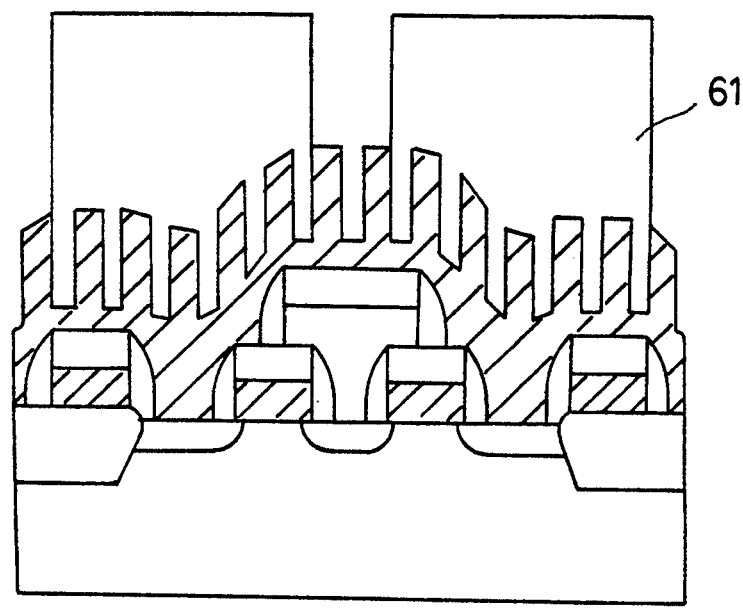
Figure 3D:
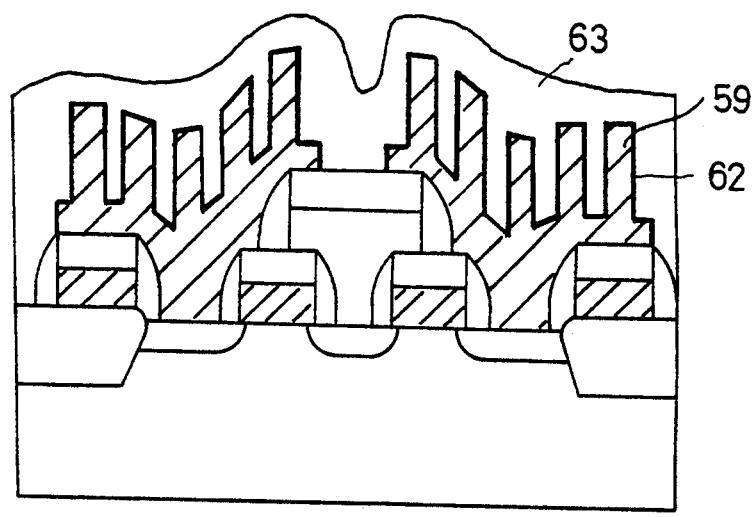

Thereafter, the polysilicon film 59 is partially removed at its portion disposed over the field oxide film 51 and the bit line 56 by using a node mask 61, so as to isolate elements from one another, as shown in FIG. 3C.

As shown in FIG, 3D, a dielectric film 62 is then formed over the storage node polysilicon film 59. Thereafter, a formation of a plate node 63 on the dielectric film 62 is carried out. Thus, a capacitor is made.

FIG. 3E shows a DRAM device with the structure obtained according to the above-mentioned method of the present invention. The DRAM device comprises a smoothing film 64 deposited on the semiconductor substrate 50 and metal lines 65 formed on the smoothing film 64. The smoothing film 64 comprises a boron phosphorous silicate glass (BPSG) film or an oxide film.

The DRAM device has the structure wherein the storage node has a plurality of uniformly spaced pillars arranged in one direction. In this structure, the height of each pillar can be increased up to 5,000 Å, thereby enabling the surface area of storage node to increase. Accordingly, it is possible to obtain the capacitance of 30 pF or more.

Referring to FIGS. 4A to 4H, there is illustrated a method of making a semiconductor memory device in accordance with a second embodiment of the present invention.

The method, according to the second embodiment of the present invention, is a method for increasing the cell capacitance, by patterning a polysilicon film in a double photo exposure manner using a mask having a plurality of uniformly arranged rectangular phase shifters, thereby forming a storage node having a plurality of pillars arranged independently or intersectionally in planar (in a two-dimensional plane that intersects the pillars perpendicularly).

Figure 4A:
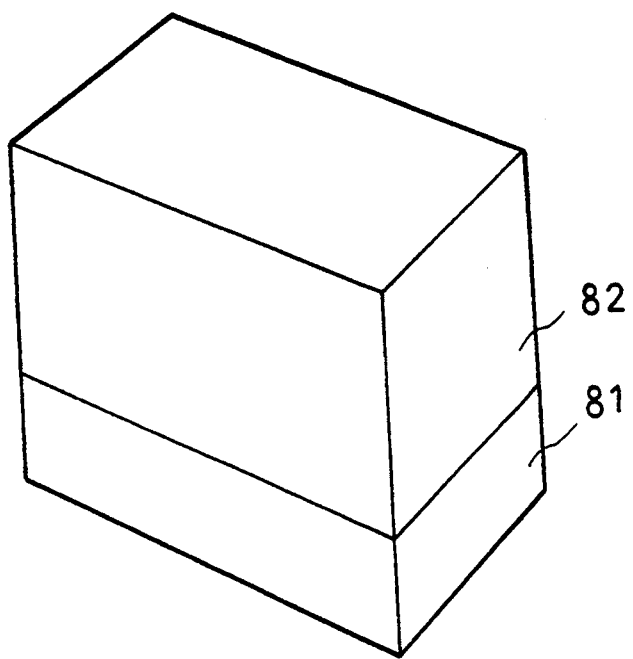
Figure 4B:
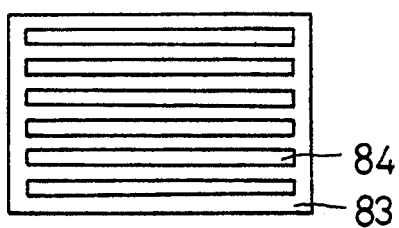

FIG. 4A shows a condition that over a semiconductor substrate over which are formed a transistor, a bit line, a smoothing insulating film and a polysilicon film for a storage node, in this order.

In FIG. 4A, the reference numeral 81 denotes a semiconductor substrate on which a transistor, a bit line and a smoothing insulating film are formed by the processes similar to those shown in FIGS. 3A to 3D. On the other hand, the reference numeral 82 denotes a storage node polysilicon film deposited over the smoothed semiconductor substrate 81 provided with the transistor and bit line.

Figure 4C:
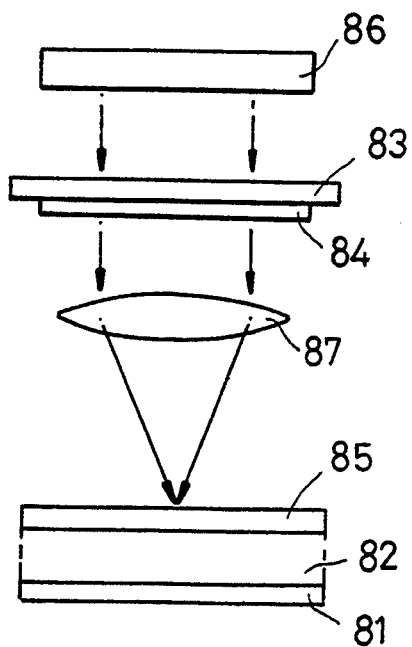

FIG, 4B illustrates a step for preparing a glass mask having phase shifters. The glass mask which is denoted by the reference numeral 83 has a plurality of uniformly spaced phase shifters 84 arranged in one direction, FIG. 4C shows a step for primarily photo exposing the semiconductor substrate 81 provided with the storage node polysilicon film 82. The primary photo exposure of the semiconductor substrate 81 is carried out by using a photo exposure device including a condense lens 87, 86 and a reduction lens under the condition that the glass mask 83 is spaced a predetermined distance from the semiconductor substrate 81.

In FIG. 4C, the reference numeral 85 denotes a photoresist deposited over the storage node polysilicon film 82.

Figure 4D:
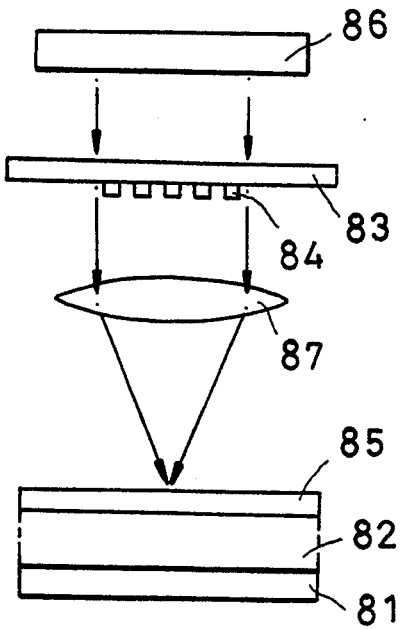

FIG. 4D shows a step for secondarily photo exposing the semiconductor substrate 81 under the same photo exposure condition as the primary photo exposure condition. Although carried out under the same photo exposure condition, the secondary photo exposure of the semiconductor substrate 81 is different from the primary photo exposure, in that it is achieved under the condition of fixing one of the glass mask 83 and the semiconductor substrate 81, while rotating the other by an angle of 90° or vice versa.

That is, the secondary photo exposure is achieved by rotating 90° the semiconductor 81 and the glass mask 83 spaced a predetermined distance from each other without shifting the other.

Accordingly, the double photo exposure using the glass mask having a plurality of rectangular phase shifters provides actually the same effect as a case of using a check-board mask.

FIGS. 4E and 4F illustrate a step for developing the photoresist after the double photo exposure. As the photoresist 85 is developed after the double photo exposure, it is patterned to have a plurality of protrusions. Where the photoresist 85 is a positive photoresist, the protrusions are formed to be uniformly separated from one another, as shown in FIG. 4E. On the other hand, where the photoresist 85 is a negative photoresist, the protrusions are formed to be intersected with one another, as shown in FIG. 4F.

Figure 4G:
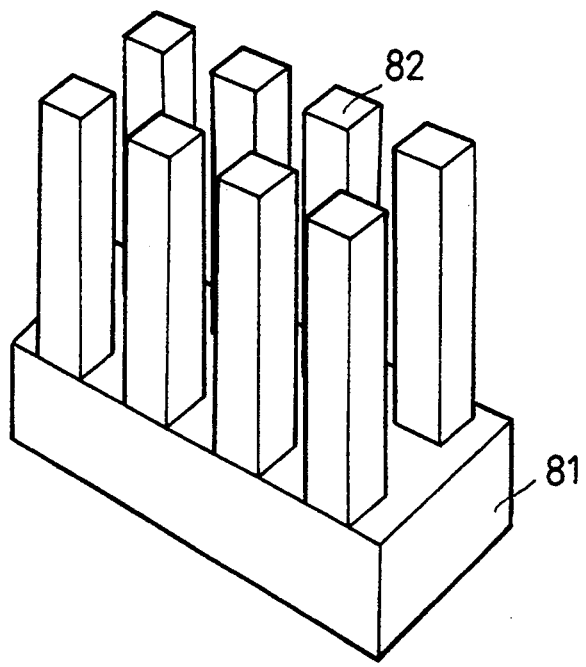
Figure 4H:
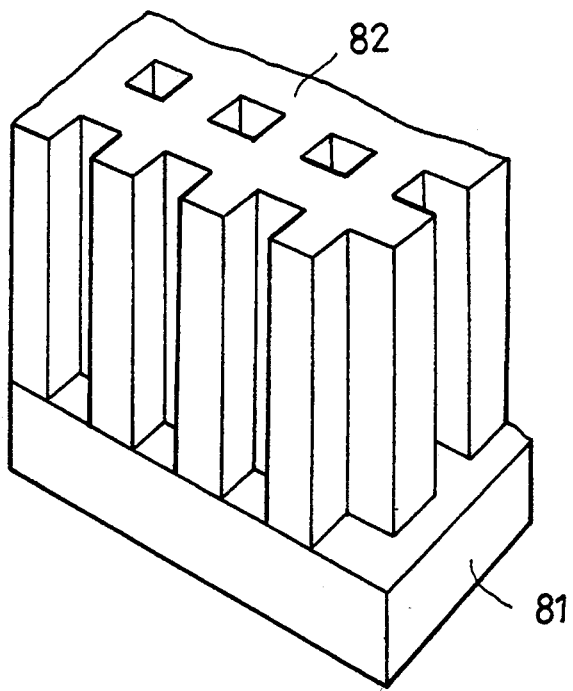

FIGS. 4G and 4H illustrate a step for patterning the polysilicon film 82 formed over the smoothed semiconductor substrate 81 by using the photoresist pattern formed as in FIGS. 4E and 4F, so as to form a storage node.

As the polysilicon film 82 is patterned according to the anisotropic dry etch method using the positive photoresist shown in FIG. 4E as a mask, a storage node having a plurality of uniformly spaced pillars arranged independently in planar (in two-dimensional plane that intersects the pillars perpendicularly), as shown in FIG. 4G. On the other hand, when the polysilicon film 82 is patterned according to the anisotropic dry etch method using the negative photoresist shown in FIG. 4F as a mask, a storage node having a plurality of pillars arranged intersectionally in planar in a two-dimensional plane that intersects the pillars perpendicularly, as shown in FIG. 4H.

Although not shown, a dielectric film is formed over the entire exposed surface of the storage node with the structure shown in FIG. 4G or 4H formed on the semiconductor substrate 81. Finally, a formation of a plate node on the dielectric film is carried out. Thus, a capacitor is made.

In case of the DRAM device made according to the second embodiment, it is possible to increase greatly the surface area of storage node, by adjusting the etched depth of the polysilicon film 82 deposited over the semiconductor substrate 81.

That is, if the etched depth of storage node polysilicon film 82 deposited over the semiconductor substrate 81 is h and the minimum space between neighboring pillars is r, the surface area $S_1$ of the storage node having independent pillars and the surface area $S_2$ of the storage node having intersectional pillars can be expressed by the following equation:

$$S_1 = S_2 = 2r^2 + 4rh \qquad (2)$$

Accordingly, the ratio of the surface area of the storage node with the pillars according to the present invention to the surface area of the conventional storage node having a planar surface can be expressed by the following equation:

$$\frac{S_1}{S_C} = \frac{S_2}{S_C} = \frac{2r^2 + 4th}{2r^2} = 1 + \frac{2h}{r} \qquad (3)$$

Therefore, where the etched depth h it is considerably larger than the minimum space r, it is possible to increase greatly the surface of storage node, as apparent from the equation 3.

As apparent from the above description, the present invention enables the surface area of storage node and thus the cell capacitance to greatly increase. The process for forming a storage node is also simplified, in that it is carried out using a electron beam mask and a storage node mask. In particular, the photoresist is patterned in a direct electron beam writing manner, thereby enabling pillars of the storage node to be accurately defined and controlled.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A method of making a semiconductor memory device comprising the steps of:
   forming a transistor on a semiconductor substrate;
   forming a polysilicon film over exposed surfaces of the semiconductor substrate;
   preparing a glass mask having a plurality of phase shifters;
   coating a photoresist over the polysilicon film;
   primarily photo exposing the semiconductor substrate under the condition of fixing the glass mask at a position spaced a distance from the semiconductor substrate;
   secondarily photo exposing the semiconductor substrate under the condition of rotating 90° the semiconductor substrate at the same position as in the step of primarily photo exposing the semiconductor substrate;
   developing the photoresist to form a photoresist pattern;
   etching the polysilicon film using the photoresist pattern as a mask, to form a storage node having a plurality of pillars; p1 removing the photoresist;

2. A method in accordance with claim 1, wherein the phase shifters have a rectangular shape and are arranged on the glass mask in one direction and uniformly spaced from one another.

3. A method in accordance with claim 1, wherein the step of secondarily photo exposing the semiconductor substrate is carried out under the condition of rotating the glass mask ninety degrees (90°), in place of the condition of rotating the semiconductor substrate ninety degrees (90°).

4. A method in accordance with claim 1, wherein the photoresist comprises one of a positive photoresist or a negative photoresist.

5. A method in accordance with claim 1, wherein the photoresist comprises a positive photoresist and further the pillars of the storage node are arranged independently and uniformly spaced from one another.

6. A method in accordance with claim 1, wherein the photoresist comprises a negative photoresist and further the pillars of the storage node are intersectionally arranged.

7. A method in accordance with claim 4, wherein the photoresist comprises a positive photoresist and further the pillars of the storage node are arranged independently and uniformly spaced from one another.

8. A method in accordance with claim 4, wherein the photoresist comprises a negative photoresist and further the pillars of the storage node are intersectionally arranged.

* * * * *